United States Patent
Sato et al.

(10) Patent No.: US 8,201,722 B2
(45) Date of Patent: Jun. 19, 2012

(54) RESONATOR FOR JOINING METAL MEMBERS TOGETHER UTILIZING ULTRASONIC VIBRATION

(75) Inventors: Shigeru Sato, Fukuoka (JP); Mayumi Kouya, Fukuoka (JP); Mitsugu Katsumi, Fukuoka (JP); Ryoichi Ishii, Fukuoka (JP); Takahiro Ito, Fukuoka (JP)

(73) Assignee: Ultex Corporation, Fukuoka (JP)

( * ) Notice: Subject to any disclaimer, the term of this patent is extended or adjusted under 35 U.S.C. 154(b) by 0 days.

(21) Appl. No.: 12/793,251

(22) Filed: Jun. 3, 2010

(65) Prior Publication Data
US 2010/0320255 A1    Dec. 23, 2010

(30) Foreign Application Priority Data

Jun. 22, 2009 (JP) ................................. 2009-148104

(51) Int. Cl.
  B23K 1/06    (2006.01)
  B29C 65/08   (2006.01)
  B32B 37/00   (2006.01)

(52) U.S. Cl. ............... 228/1.1; 228/110.1; 156/580.2

(58) Field of Classification Search .................. None
See application file for complete search history.

(56) References Cited

U.S. PATENT DOCUMENTS

| | | | |
|---|---|---|---|
| 3,612,385 A * | 10/1971 | Humpage ................ | 228/1.1 |
| 3,640,786 A * | 2/1972 | Carpenter ................ | 156/73.2 |
| 3,752,380 A * | 8/1973 | Shoh ..................... | 228/1.1 |
| 3,813,021 A * | 5/1974 | Kramer ................... | 228/1.1 |
| 4,540,113 A | 9/1985 | Shimazaki | |
| 4,752,351 A * | 6/1988 | Lunt ...................... | 156/580.1 |
| 5,011,062 A * | 4/1991 | Nakanishi et al. ...... | 228/1.1 |
| 5,171,387 A * | 12/1992 | Wuchinich .............. | 156/73.3 |
| 5,549,544 A | 8/1996 | Young et al. | |
| 5,603,444 A * | 2/1997 | Sato ....................... | 228/1.1 |
| 5,730,832 A * | 3/1998 | Sato et al. .............. | 156/499 |
| 5,947,364 A * | 9/1999 | Tamura et al. .......... | 228/1.1 |
| 5,976,316 A * | 11/1999 | Mlinar et al. ........... | 156/580.2 |
| 6,078,125 A * | 6/2000 | Roberts .................. | 310/325 |
| 6,109,502 A * | 8/2000 | Sato ....................... | 228/1.1 |
| 6,168,063 B1 * | 1/2001 | Sato et al. .............. | 228/1.1 |
| 6,247,628 B1 * | 6/2001 | Sato et al. .............. | 228/1.1 |

(Continued)

FOREIGN PATENT DOCUMENTS

EP    2 113 331 A1    11/2009

(Continued)

OTHER PUBLICATIONS

European Search Report issued in European Application No. 10164602.4-2302.

(Continued)

Primary Examiner — Kiley Stoner
(74) Attorney, Agent, or Firm — Sughrue Mion, PLLC

(57) ABSTRACT

A resonator for joining metal members utilizing ultrasonic vibration includes an ultrasonic horn having a length of at least half wavelength of a resonance frequency of ultrasonic vibration transmitted from a vibrator, and a joining tool provided on the ultrasonic horn so as to project in a direction normal to a vibration transmission direction of the ultrasonic horn at a position of a point of a maximum vibration amplitude of the ultrasonic horn. The joining tool is formed into a linear bar made of a material excellent in acoustic property and is provided on a distal end thereof with a tool head projecting laterally.

12 Claims, 6 Drawing Sheets

U.S. PATENT DOCUMENTS

| | | | | |
|---|---|---|---|---|
| 6,491,785 | B1* | 12/2002 | Sato et al. | 156/379.6 |
| 6,758,383 | B2* | 7/2004 | Nishiura et al. | 228/4.5 |
| 7,871,481 | B2* | 1/2011 | Kasai | 156/73.1 |
| 2002/0066767 | A1* | 6/2002 | Takahashi et al. | 228/110.1 |
| 2003/0006265 | A1* | 1/2003 | Sato | 228/1.1 |
| 2003/0019561 | A1* | 1/2003 | Tominaga et al. | 156/73.1 |
| 2003/0038158 | A1* | 2/2003 | Takahashi et al. | 228/110.1 |
| 2003/0116014 | A1* | 6/2003 | Possanza et al. | 95/30 |
| 2003/0136523 | A1* | 7/2003 | Takahashi et al. | 156/580.1 |
| 2003/0160084 | A1* | 8/2003 | Higashiyama | 228/1.1 |
| 2004/0065415 | A1* | 4/2004 | Sato et al. | 156/580.1 |
| 2004/0211812 | A1* | 10/2004 | Hizukuri et al. | 228/1.1 |
| 2005/0199676 | A1* | 9/2005 | Stroh et al. | 228/1.1 |
| 2005/0238819 | A1* | 10/2005 | Beretitsch et al. | 427/600 |
| 2005/0247408 | A1* | 11/2005 | Jung | 156/580.1 |
| 2006/0043149 | A1* | 3/2006 | Matsumura | 228/1.1 |
| 2006/0090833 | A1* | 5/2006 | Matsumura et al. | 156/73.1 |
| 2006/0091185 | A1 | 5/2006 | Matsumura et al. | |
| 2006/0097028 | A1* | 5/2006 | Kainuma et al. | 228/110.1 |
| 2006/0113350 | A1* | 6/2006 | Ozaki et al. | 228/1.1 |
| 2007/0144680 | A1* | 6/2007 | Kawada et al. | 156/580.1 |
| 2007/0187457 | A1* | 8/2007 | Minamitani et al. | 228/1.1 |
| 2007/0199972 | A1* | 8/2007 | Chong et al. | 228/1.1 |
| 2007/0257083 | A1* | 11/2007 | Narasimalu et al. | 228/1.1 |
| 2008/0048003 | A1* | 2/2008 | Ozaki et al. | 228/1.1 |
| 2008/0048004 | A1* | 2/2008 | Ozaki et al. | 228/1.1 |
| 2008/0087708 | A1* | 4/2008 | Ozaki et al. | 228/1.1 |
| 2008/0121679 | A1* | 5/2008 | Li et al. | 228/1.1 |
| 2008/0265002 | A1* | 10/2008 | Kainuma et al. | 228/1.1 |
| 2008/0265003 | A1* | 10/2008 | Kainuma et al. | 228/110.1 |
| 2009/0255979 | A1* | 10/2009 | Saito et al. | 228/1.1 |
| 2009/0266869 | A1* | 10/2009 | Sato et al. | 228/1.1 |
| 2010/0006621 | A1* | 1/2010 | Masuda et al. | 228/1.1 |
| 2010/0040903 | A1* | 2/2010 | Kalt et al. | 428/615 |
| 2010/0065613 | A1* | 3/2010 | Nasu et al. | 228/110.1 |
| 2010/0116409 | A1* | 5/2010 | Yamamoto | 156/73.1 |
| 2010/0176184 | A1* | 7/2010 | Sheehan et al. | 228/110.1 |

FOREIGN PATENT DOCUMENTS

| | | | |
|---|---|---|---|
| JP | 03-000494 A | * | 1/1991 |
| JP | 2911394 B2 | | 3/1997 |
| JP | 09-314360 A | * | 12/1997 |
| JP | 11-314168 A | | 11/1999 |
| JP | 2002-043377 A | | 2/2002 |
| JP | 2003-023031 A | | 1/2003 |
| JP | 2009-113083 A | | 5/2009 |
| JP | 2009-267265 A | | 11/2009 |
| RU | 1111866 A | | 9/1984 |

OTHER PUBLICATIONS

Database WPI Week 198514, Thomas Scientific, London, GB; AN 1985-085427; XP002602438.

European Communication dated Oct. 24, 2011 issued in European Application No. 10164602.4 (4 pages).

* cited by examiner

H1<H2

RESONATOR FOR JOINING METAL MEMBERS TOGETHER UTILIZING ULTRASONIC VIBRATION

BACKGROUND OF THE INVENTION

1. Field of the Invention

The present invention relates to a resonator for joining metal members together utilizing ultrasonic vibration, capable of joining together members to be joined (hereinafter referred to as the "joining target members") even when an article has the joining target members disposed at its deep position.

2. Description of the Prior Art

FIG. 9 shows an apparatus 45 for joining metal members together utilizing ultrasonic vibration disclosed in JP-A 2009-113083. The joining apparatus 45 is provided with a resonator 41 used for joining metal members together utilizing ultrasonic vibration. In FIG. 9, the resonator 41 has a structure in which a joining tool 43 is connected to one end of an ultrasonic horn 42. A vibrator 44 is attached to the other end of the ultrasonic horn 42.

The operation of the joining apparatus 45 will next be described. For example, the ultrasonic horn 42 is attached to a block 46 of the joining apparatus 45 and joining target members 48 having plural metal members stacked one on top of another are mounted on a receiving pedestal 47 disposed below the joining tool 43. The joining apparatus 45 is then moved relative to the receiving pedestal 47 and, in a state in which the joining target members 48 are pressurized between the joining tool 43 and the receiving pedestal 47, lateral ultrasonic vibration at the lower end of the joining tool 43 is transmitted to the joining target members 48 to join together contact surfaces of the stacked plural metal members in the joining target members 48.

In the joining tool 43 shown in FIG. 9, however, a tool head 49 on the side of the joining target members 48 has a lateral outer profile smaller than that of the upper portion of the joining tool 43 on the side of the ultrasonic horn 42. For this reason, a case where the joining target members 48 are to be joined to an article 50 shown in FIG. 10 has the following disadvantages. The article 50 has a projecting portion 51 disposed above the joining target members 48 and, when a space H1 between the joining target members 48 and the projecting portion 51 is smaller than a dimension H2 between the lower surface of the joining tool 43 and the lower surface of the ultrasonic horn 42, i.e. when H1<H2, and in other words in a case where the article 50 has the joining target members 48 disposed at its deep position, the resonator 41 cannot enter the space H1 between the joining target members 48 and the projecting portion 51 and, as a result, the joining target members 48 cannot be joined together.

The problem to be solved by the present invention lies in that the joining target members cannot be joined together when the article has the joining target members disposed at its deep position.

SUMMARY OF THE INVENTION

In order to solve the above problem, according to the present invention, there is provided a resonator for joining metal members utilizing ultrasonic vibration, comprising an ultrasonic horn having a length of at least half wavelength of a resonance frequency of ultrasonic vibration transmitted from a vibrator and a joining tool provided on the ultrasonic horn so as to project in a direction normal to a vibration transmission direction of the ultrasonic horn at a position of a point of a maximum vibration amplitude of the ultrasonic horn, wherein the joining tool is formed in the shape of a linear bar made of a material excellent in acoustic property and is provided on a distal end thereof with a tool head projecting laterally.

The present invention is characterized mainly in that the joining tool provided on the ultrasonic horn so as to project in the direction normal to the vibration transmission direction of the ultrasonic horn at a position of the point of the maximum vibration amplitude of the ultrasonic horn is formed in the shape of a linear bar made of a material excellent in acoustic property and that the tool head is provided on the distal end of the joining tool so as to project in the lateral direction.

In the present invention, since the tool head projects laterally from the distal end of the joining tool, the portion of the tool head projecting in the lateral direction can be inserted into the space, insofar as the space between the joining target members and the projecting portion disposed above the joining target members has the space capable of admitting the tool head projecting in the lateral direction of the tool head, even when the article has the joining target members disposed at its deep position and, as a result, the joining target members can effectively be joined together appropriately.

In the present invention, when the lateral width of the distal end of the joining tool has been made smaller than that of the upper portion of the joining tool, the distal end can be vibrated better than in the case where the former width is not smaller than the latter width, by causing the direction of the former width to conform to a direction in which the ultrasonic horn is vibrated, thereby enabling the joining target members to be well joined together.

In the present invention, when the tool head has been provided therein with a concave portion open in the lateral direction and downward, the concave portion can function as an escape for preventing interference with the joining target members.

In the present invention, when the tool head has been provided therein with a slit open in the lateral direction and downward, the joining tool can receive effective vibration through adjustment of the depth and lateral width of the slit.

In the present invention, when the tool head has been joined to the distal end of the joining tool with a joining material, the tool head can be changed with another through melting the joining material.

The above and other objects, characteristic features and advantages of the present invention will become apparent from the description to be given herein below with reference to the accompanying drawings.

DETAILED DESCRIPTION OF THE PREFERRED EMBODIMENTS

The first embodiment of an apparatus 25 for joining metal members together utilizing ultrasonic vibration according to the present invention will be described. The forward, backward, leftward, rightward, upward and downward directions used herein are directions defined when the joining apparatus 25 disposed in a state shown in FIG. 2 has been seen from the front side shown by arrow S.

Figure 1:
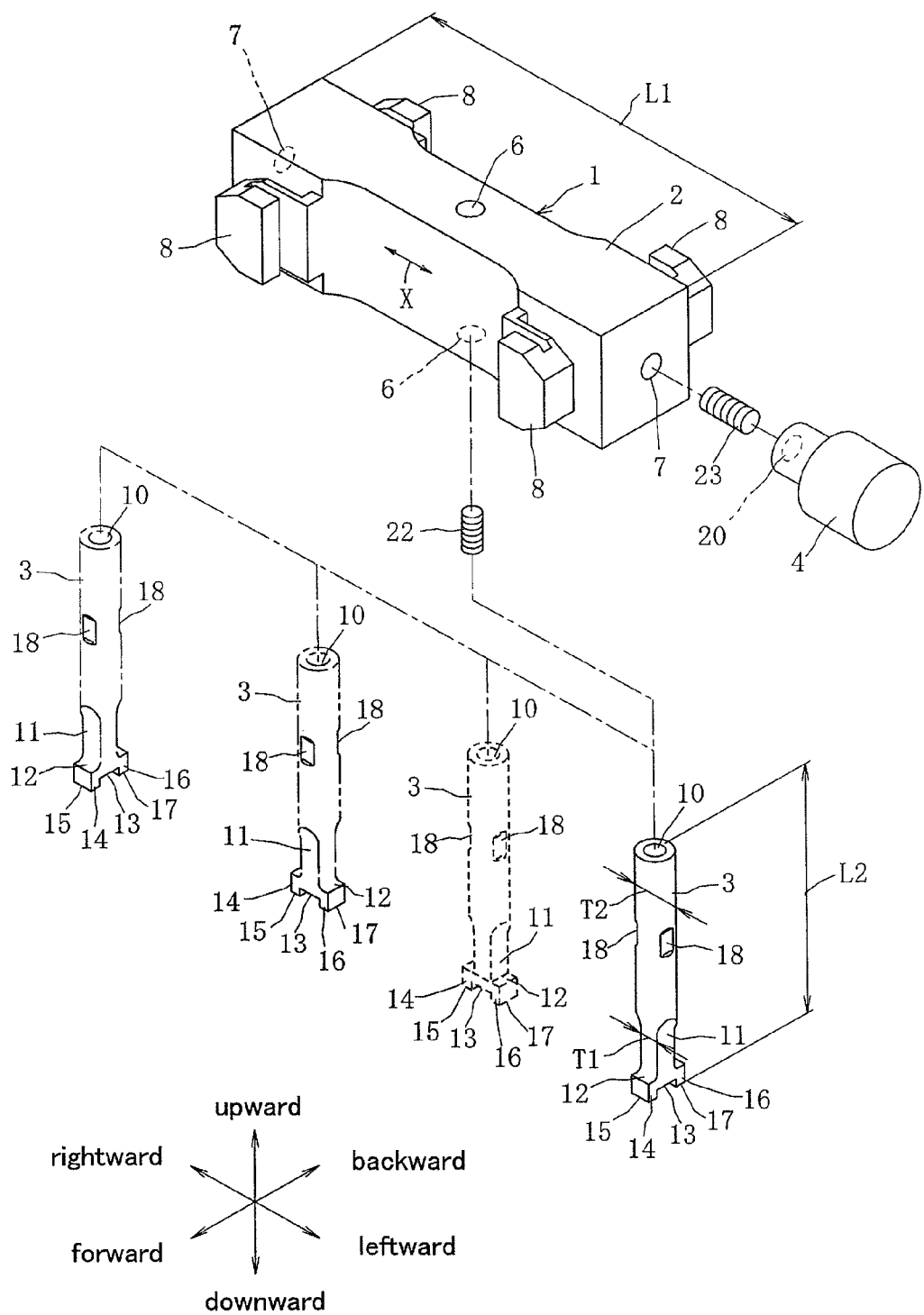
FIG. 1 is an exploded perspective view showing a resonator of the first embodiment according to the present invention.

The first embodiment of the configuration of a resonator 1 for joining metal members together utilizing ultrasonic vibration according to the present invention will be described with reference to FIG. 1. The resonator 1 is provided with an ultrasonic horn 2 and a joining tool 3. While the ultrasonic horn 2 has a length L1 from one end to the other end that may correspond to at least half wavelength of a resonance frequency of ultrasonic vibration transmitted from a vibrator 4, it is set here to have the length L1 corresponding to one wavelength thereof. The ultrasonic horn 2 is formed in the shape of a linear bar made of a material excellent in acoustic property, such as aluminum or titanium alloy or hardened iron. The points of maximum vibration amplitude exist at the opposite ends and center of the ultrasonic horn 2 in the lengthwise direction. At the position of the point of maximum vibration amplitude existing at the center of the ultrasonic horn 2 in the lengthwise direction, a tool connection part 6 is formed in the form of a screw hole having internal threads formed therein.

At the opposite ends of the ultrasonic horn 2 in the lengthwise direction, component connection parts 7 are formed in the form of screw holes each having internal threads formed therein. At positions of points of minimum vibration amplitude between the center and each of the opposite ends of the ultrasonic horn 2 in the lengthwise direction, support parts 8 are formed to extend outward from the outer surface of the ultrasonic horn 2. The point of minimum vibration amplitude is also called a nodal point. Since the ultrasonic horn 2 is formed in the shape of a square bar, though it may be formed in the shape of a circular bar, it is not provided with any tool-fitting part though it may be provided with the tool-fitting part.

In the case of the ultrasonic horn 2 formed into a circular bar, the support parts 8 may surround the ultrasonic horn 2 in the circumferential direction. This case is clearly shown in FIG. 4 or FIG. 8 of Japanese Patent No. 2911394. The ultrasonic horn 2 may have a complicated structure, in which the center having the tool connection part 6 and the opposite ends having the support parts 8 are coaxially connected to each other with fixtures. That is to say, the structure of the ultrasonic horn 2 is not limited to that shown in FIG. 1.

The joining tool 3 is formed into a linear bar made of a material excellent in acoustic property, such as aluminum or titanium alloy or hardened iron. The joining tool 3 is provided in the proximal end thereof with a horn connection part 10 in the form of a screw hole having internal threads formed therein. The proximal end of the joining tool 3 constitutes a portion corresponding to the upper portion of the joining tool 3 in the case where the joining tool 3 has been attached to the ultrasonic horn 2.

The joining tool 3 has a distal end 11 that is a portion corresponding to the lower portion of the joining tool in the case where the joining tool 3 has been attached to the ultrasonic horn 2. Though the distal end 11 is not required to be slender, it has a lateral width T1 smaller than a lateral width T2 of the upper portion of the joining tool 3 (T1<T2). The lateral widths T1 and T2 are those in the direction normal to the direction in which a tool head 12 projects. That is to say, since the lateral width T1 of the distal end 11 of the joining tool 3 is smaller than the lateral width T2 of the upper portion of the joining tool 3, by causing the direction of the lateral width T1 of the distal end 11 of the joining tool 11 to conform to the vibration direction of the ultrasonic horn 2 shown by arrow X in FIG. 1, the distal end 11 of the joining tool 3 is vibrated better than in the case where the lateral width T1 is not smaller than the lateral width T2, thereby enabling the joining target members to be well joined together.

The distal end 11 of the joining tool 3 is provided with the tool head 12 projecting from the distal end 11 of the joining tool 3 in the lateral direction. The structure shown by the solid line in FIG. 1, for example, is in a state in which the tool head 12 projects in the front-back direction, with the lateral width T1 of the distal end 11 directed in the horizontal direction. The structure shown by the dotted line in FIG. 1 is in a state in which the tool head 12 projects in the horizontal direction, with the lateral width T1 of the distal end 11 directed in the horizontal direction. The structure shown by the imaginary line in FIG. 1 is in a state in which the tool head 12 projects in the horizontal direction, with the lateral width T1 of the distal end 11 directed in the front-back direction. The structure shown by the alternate long and short line in FIG. 1 is in a state in which the tool head 12 projects in the front-back direction, with the lateral width T1 of the distal end 11 directed in the front-back direction. The directions in which the tool head 12 projects are not limited to these as described above insofar as the tool head 12 projects in the lateral direction normal to the center line extending in the vertical direction of the joining tool 3 from the distal end 11 of the tool head 12.

The tool head 12 is provided with a concave portion 13 open downward and in the lateral direction. The lateral direction in which the concave portion 13 opens may be a direction intersecting with the direction in which the tool head 12 projects. The concave portion 13 serves as an escape for preventing interference with the joining target members 48 (refer to FIG. 3) in the case where the metal members are to be joined together. Returning to FIG. 1, the portion of the tool head 12 projecting from the concave portion 13 in at least one direction is a portion functioning as a joining operation portion 14 in the case where the joining target members are to be joined together. The joining operation portion 14 has a lower surface 15 coming into contact with the joining target members 48 and having a convexo-concave shape.

Though the portion of the tool head 12 projecting from the concave portion 13 in the other direction may function only as a portion for balancing the vibration of the joining tool 3, it may be configured as a joining operation portion 16 for joining the metal members together similarly to the portion of the tool head projecting in the one direction. In the case where the portion projecting in the other direction functions as the joining operation portion 16, the joining operation portion 16 preferably has a lower surface 17 coming into contact with the joining target members 48 and having a convexo-concave shape. As a result, when the lower surface 15 of the joining operation portion 14 has been worn away through repetition of the step of joining the metal members together, the joining operation portions 14 and 16 are changed in position so that the joining operation portion 14 may be directed backward and the joining operation portion 16 may be directed forward, and the joining tool 3 is then attached to the ultrasonic horn 2. Consequently, the joining operation portion 16 can appropriately fulfill its function instead of the joining operation portion 14.

Though the portion of the joining tool 3 from the proximal end to the distal end 11 may have a square-bar shape, it has a circular-bar shape. Therefore, the joining tool 3 is provided on the outer surface thereof with a pair of tool-fitting portions 18 in the form of parallel surfaces. That is to say, when the joining tool 3 is attached to the ultrasonic horn 2, a tool like a wrench is fitted in the tool-fitting portions 18 and rotated to enable the joining tool 3 to be appropriately fixed to the ultrasonic horn 2. When the portion of the joining tool 3 has the square-bar shape, it is unnecessary to provide the joining tool 3 with the tool-fitting portions 18.

The joining tool 3 has a length L2 between the upper surface and the lower surface 14 or 17, which may sufficiently have at least half wavelength of the vibration frequency of the joining tool 3 resonating with the vibration of the ultrasonic horn 2, but is set to have 2 wavelengths. When the joining tool 3 has resonated with the vibration of the ultrasonic horn 2, the points of maximum vibration amplitude are positioned at the proximal end and joining operation portion of the joining tool 3. That is to say, when the joining tool 3 has resonated with the vibration of the ultrasonic horn 2, the joining operation portion is vibrated at the maximum vibration amplitude in the lateral direction.

The vibrator 4 is provided at an output end thereof with a component connection part 20 in the form of a screw hole having internal threads formed therein.

Figure 2:
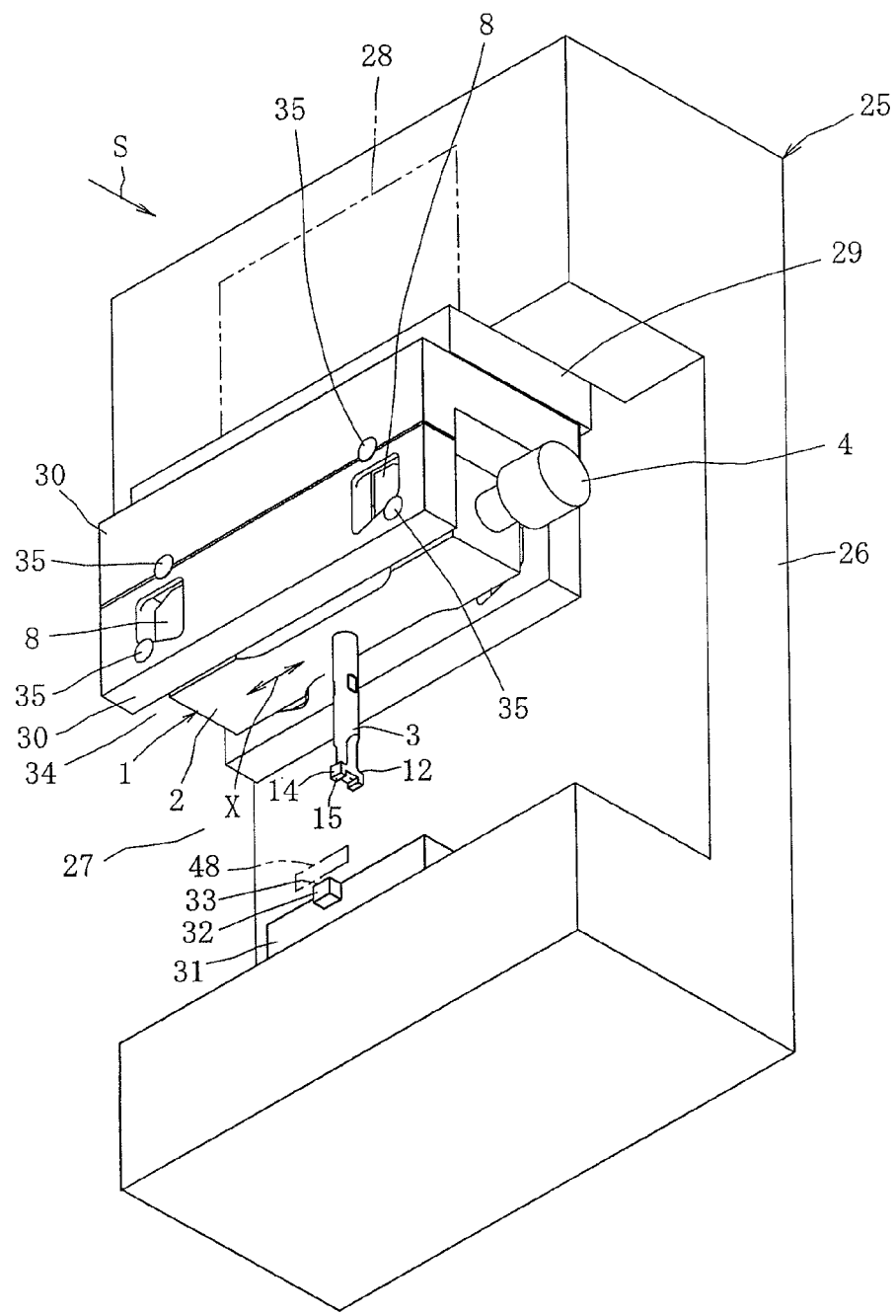
FIG. 2 is a perspective showing an apparatus for joining metal members together utilizing ultrasonic vibration, which is provided with the resonator of the first embodiment.

For joining the ultrasonic horn 2 and the joining tool 3 to each other, a headless screw 22 as a fixture has one end thereof attached to the tool connection part 6 of the ultrasonic horn 2 and the other end thereof attached to the horn connection part 10 of the joining tool 3 to bring the proximal end of the joining tool 3 into contact with the ultrasonic horn 2. As a result, the resonator 1 is configured as shown in FIG. 2. Returning to FIG. 1, in the case where the joining tool 3 is joined to the ultrasonic horn 2, there are the case where the tool head 12 is directed in the front-back direction as shown by the solid line or alternate long and short dash line and the case where the tool head 12 is directed in the horizontal direction as shown by the dotted line or imaginary line. In both the cases, the direction of the vibration of the tool head 12 is shown by arrow X.

In place of the headless screw 22, a male screw may be formed on the tool connection part 6 of the ultrasonic horn 2 or on the horn connection part 10 of the joining tool 3 and attached to the horn connection part 10 of the joining tool 3 or the tool connection part 6 of the ultrasonic horn 2 to thereby join the ultrasonic horn 2 and the joining tool 3 to each other. In addition, in place of the headless screw 22, a headed screw like a bolt may be used to join the ultrasonic horn 2 and the joining tool 3 to each other. In this case, however, the tool connection part 6 is formed in the form of a vertical through hole, for example, and the headed screw is passed from above the ultrasonic horn 2 through the tool connection part 6 and attached to the horn connection part 10 of the joining tool 3, thereby joining the ultrasonic horn 2 and the joining tool 3 to each other. Otherwise, the joining tool 3 may be joined to the ultrasonic horn 2 with a joining material like brazing filler metal.

The vibrator 4 or a booster (not shown) is attached to one end of the ultrasonic horn 2. In the case where the vibrator 4 is attached to one end of the ultrasonic horn 2, a headless screw 23 has one end thereof attached to the component connection part 7 of the ultrasonic n 2 and the other end thereof attached to the component connection portion 20 of the vibrator 4. As a result, the ultrasonic horn 2 and the vibrator 4 are coaxially joined to each other as shown in FIG. 2.

In the case where the booster (not shown) is attached to one end of the ultrasonic horn 2, a headless screw (not shown) corresponding to the headless screw 23 has one end thereof attached to the component connection part 7 of the ultrasonic horn 2 and the other end thereof attached to a component attachment portion (not shown) formed at one end of the booster in the form of a screw hole having internal threads formed therein, and the headless screw 23 has one end thereof attached to a component attachment portion (not shown), corresponding to the component attachment portion, formed at the other end of the booster and the other end thereof attached to the component connection portion 20 of the vibrator 4. As a result, the ultrasonic horn 2 and the booster are coaxially joined to each other.

The structure of the apparatus 25 for joining metal members together utilizing ultrasonic vibration, in which the resonator 1 is used, will be described with reference to FIG. 2. The joining apparatus 25 has an apparatus frame 26 provided therein with an operation space portion 27 and above the operation space portion 27 with a pressurization mechanism 28. The pressurization mechanism 28 has an output member 29 disposed from above the apparatus frame 26 in the operation space portion 27. The lower portion of the output member 29 disposed in the operation space portion 27 ascends and descends within the operation space portion 27 by means of the pressurization mechanism 28 driven. The lower portion of the output member 29 disposed in the operation space portion 27 is provided thereon with a support 30. The apparatus frame 26 is provided on a portion thereof below the operation space portion 27 with a receiving pedestal 31. The receiving pedestal 31 is provided on the front upper portion thereof with a joining operation receiving part 32. The joining operation receiving part 32 has an upper surface 33 coming into contact with the joining target members 48 in the case of joining the metal members together and having a convex-concave shape.

In an interior space 34 passing through the support 30 to right and left, the lengthwise direction of the ultrasonic horn 2 is directed in the horizontal direction shown by arrow X, the ultrasonic horn 2 is disposed so that the portion of the ultrasonic horn 2 other than the support parts 8 may not come into contact with the support 30, and the support parts 8 are supported on the support 30. In the case where the ultrasonic horn 2 has thus been attached to the support 30, since the support parts 8 are positioned at the points of minimum vibration amplitude existing at the opposite ends of the ultrasonic horn 2 across the joining tool 3, the ultrasonic horn 2 is attached to the support 30 via the support parts 8, with the opposite sides thereof supported, and therefore, the vibrator 4 and the booster (not shown) are also configured so as not to come into contact with the support 30.

Furthermore, in the case where the ultrasonic horn 2 has been attached to the support 30 and the output member 29 has stopped at an ascent position, the lower surface 15 of the joining operation portion 14 and the upper surface 33 of the joining operation receiving part 32 face vertically each other while leaving therebetween a space into which the joining target members 48 having plural metal members stacked one on top of another can be inserted.

The operation of joining metal members with the joining apparatus 25 will be described. First, in the state in which the joining operation portion 14 and the joining operation receiving part 32 have faced each other, the joining target members having plural metal members stacked one on top of another are mounted on the upper surface 33 of the joining operation receiving part 32 of the receiving pedestal 31. The pressurization mechanism 28 is then driven to cause the output member 29 to descend and, in association therewith, cause the resonator 1 and the vibrator 4 or booster (not shown) to descend.

In addition, after the joining target members 48 are sandwiched between the joining tool 3 and the receiving pedestal 32, for example, the vibrator 4 generates ultrasonic vibration, the ultrasonic horn 2 resonates with the ultrasonic vibration transmitted from the vibrator 4, and the joining tool 3 resonates with the vibration transmitted from the ultrasonic horn 2. As a result, the lateral-direction vibration of the joining operation portion 14 disposed at the point of maximum vibration amplitude is transmitted to the joining target members 48 to join together the contact surfaces of the joining target members having the metal members stacked one on top of another by friction.

Figure 3:
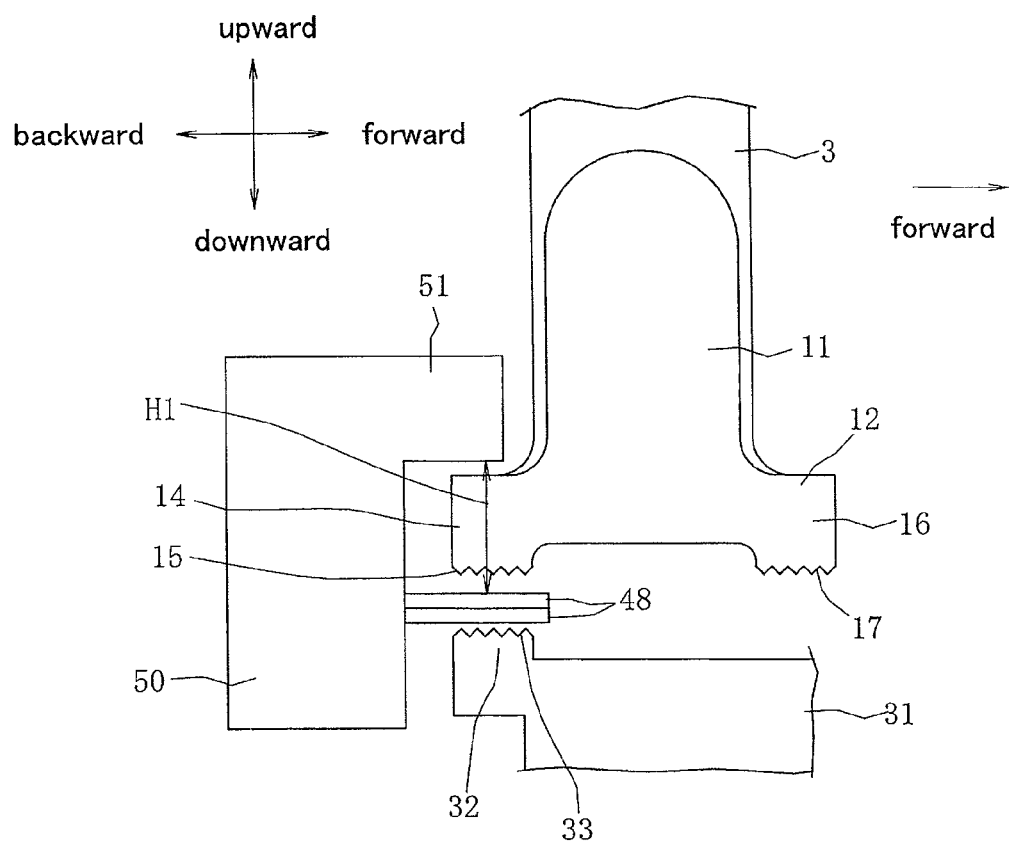
FIG. 3 is a schematic side view showing a state in which a tool head of the first embodiment is inserted into a space between joining target members and a projecting portion.

In the resonator 1 used in the joining apparatus 25, as shown in FIG. 3, the tool head 12 projects laterally from the distal end 11 of the joining tool 3, and the lower portion of the tool head 12 projecting laterally is provided with the joining operation portion 14. Even when the joining target members 48 are disposed at a deep position of an article 50, therefore, the portion of the tool head 12 projecting laterally and the joining operation portion 14 are inserted into a space H1 between the joining target members and a projecting portion 51 because the space H1 has an insertion-permitting dimension. Therefore, the joining operation portion 14 enables the joining target members to be appropriately joined together.

Figure 4:
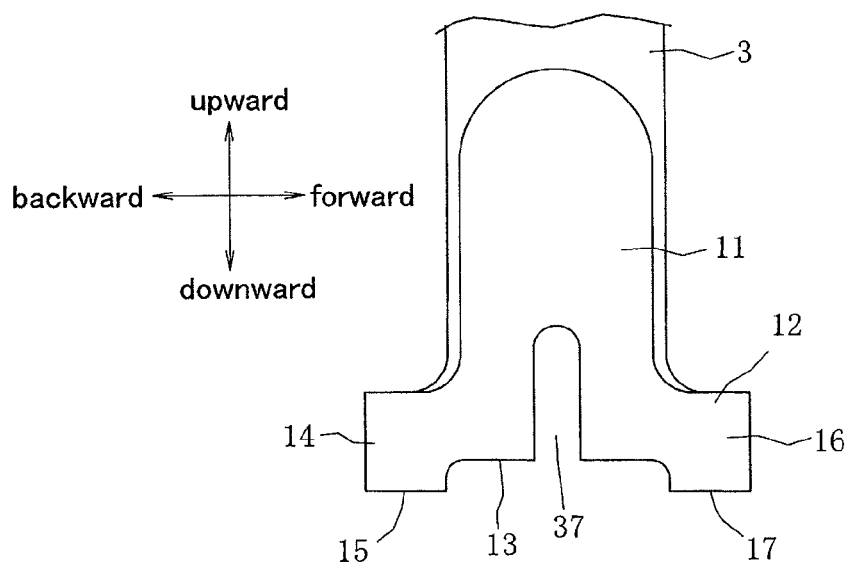
FIG. 4 is a side view showing the distal end of a joining tool for a resonator of the second embodiment according to the present invention.

The structure of the joining tool 3 according to the second embodiment of the present invention will be described with reference to FIG. 4. A joining tool 3 of this embodiment differs from the joining tool 3 shown in FIG. 1 in that it is provided therein with a slit 37. The slit 37 is formed so as to open in the lateral direction and downward of the concave portion 13. The lateral direction in which the slit 37 opens is the direction of the lateral width T1 of the distal end 11 (refer to FIG. 1). The depth and lateral width of the slit 37 are adjusted to enable the joining tool 3 to well receive vibration. The lateral width of the slit 37 indicates a width in the direction in which the tool head 12 projects.

Figure 5A:
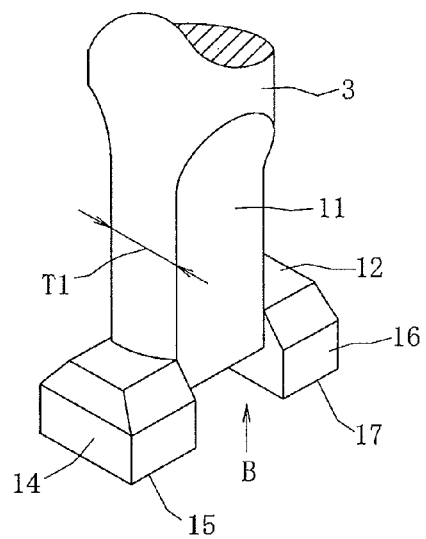
FIG. 5A is a perspective view showing the distal end of a joining tool for a resonator of the third embodiment according to the present invention, and FIG. 5B a bottom view of FIG. 5A seen from arrow B.
Figure 5B:
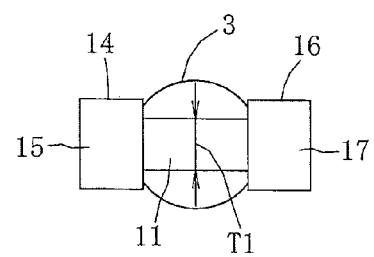

The structure of the joining tool 3 according to the third embodiment of the present invention will be described with reference to FIG. 5. A joining tool 3 of this embodiment differs from the joining tool 3 shown in FIG. 1 in that the junction operation portions 14 and 16 are formed to have larger widths than the lateral width T1 of the distal end 11.

Figure 6A:
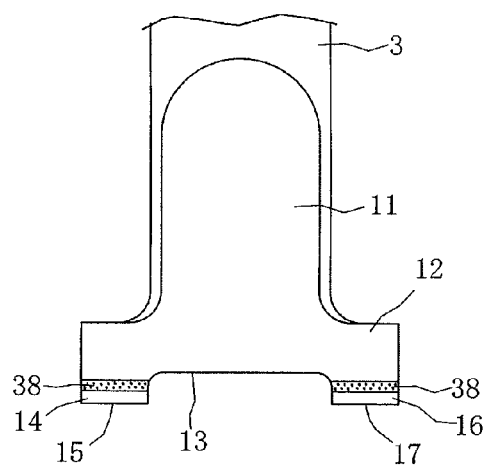
FIG. 6A and FIG. 6B are side views each showing the distal end of a joining tool for a resonator of the fourth embodiment according to the present invention.
Figure 6B:
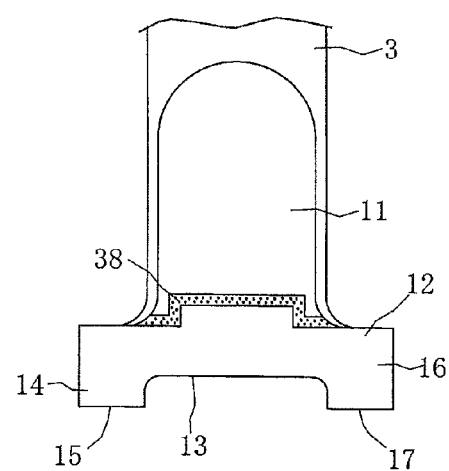

The structure of the joining tool 3 according to the fourth embodiment of the present invention will be described with reference to FIG. 6. FIG. 6A shows a state in which the joining operation portions 14 and 16 are joined to the tool head 12 with a joining material 38 like brazing filler metal, and FIG. 6B shows a state in which the tool head 12 is joined to the distal end of the joining tool 3 with the joining material 38. The joining tool 3 shown in FIG. 6A and FIG. 6B differs from the joining tool 3 shown in FIG. 1 in that the joining operation portions 14 and 16 or the tool head 12 can be changed to separate ones.

Figure 7:
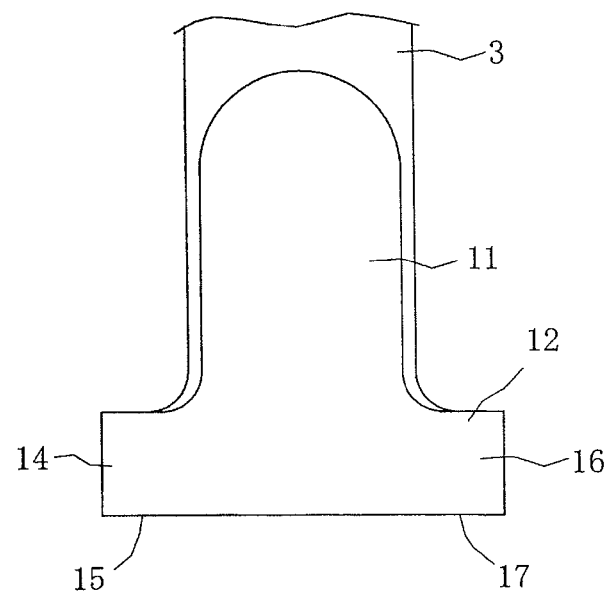
FIG. 7 is a side view showing the distal of a joining tool for a resonator of the fifth embodiment according to the present invention.

The structure of the joining tool 3 according to the fifth embodiment of the present invention will be described with reference to FIG. 7. A joining tool of this embodiment differs from the joining tool 3 shown in FIG. 1 in that the tool head 12 is provided with no concave portion 13.

Figure 8:
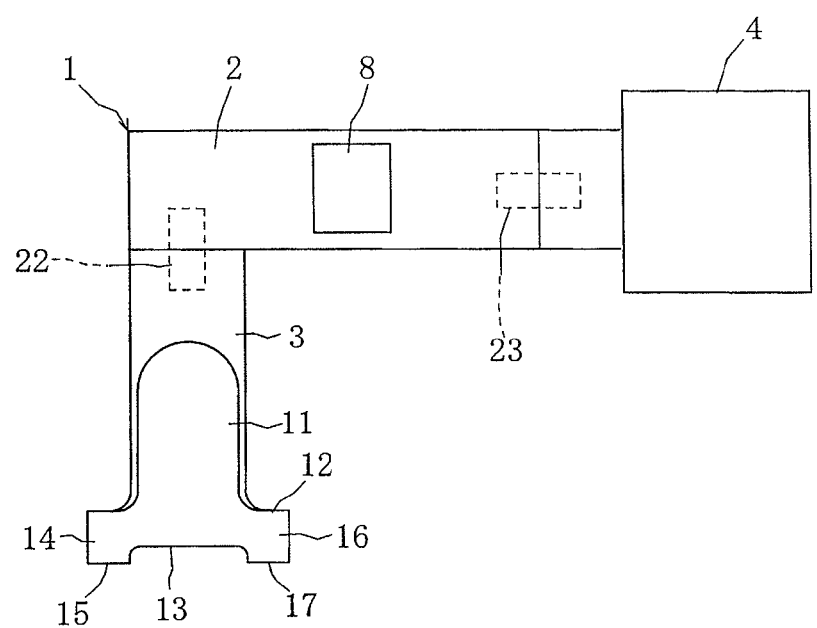
FIG. 8 is a schematic side view showing the resonator of the fifth embodiment.
Figure 9:
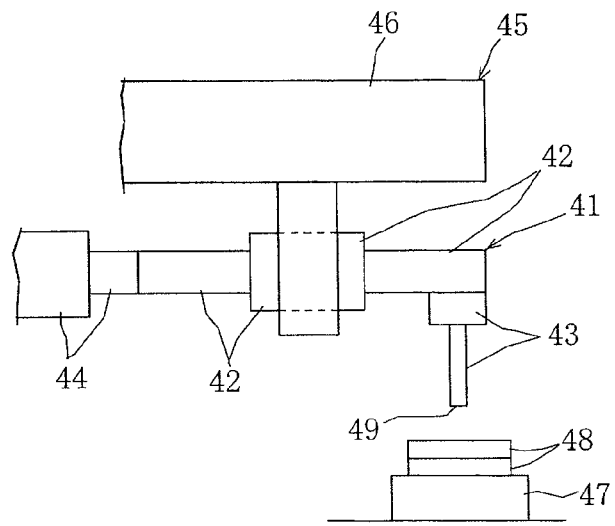
FIG. 9 is a schematic view showing an apparatus for joining metal members together utilizing ultrasonic vibration, which is provided with a conventional resonator.
Figure 10:
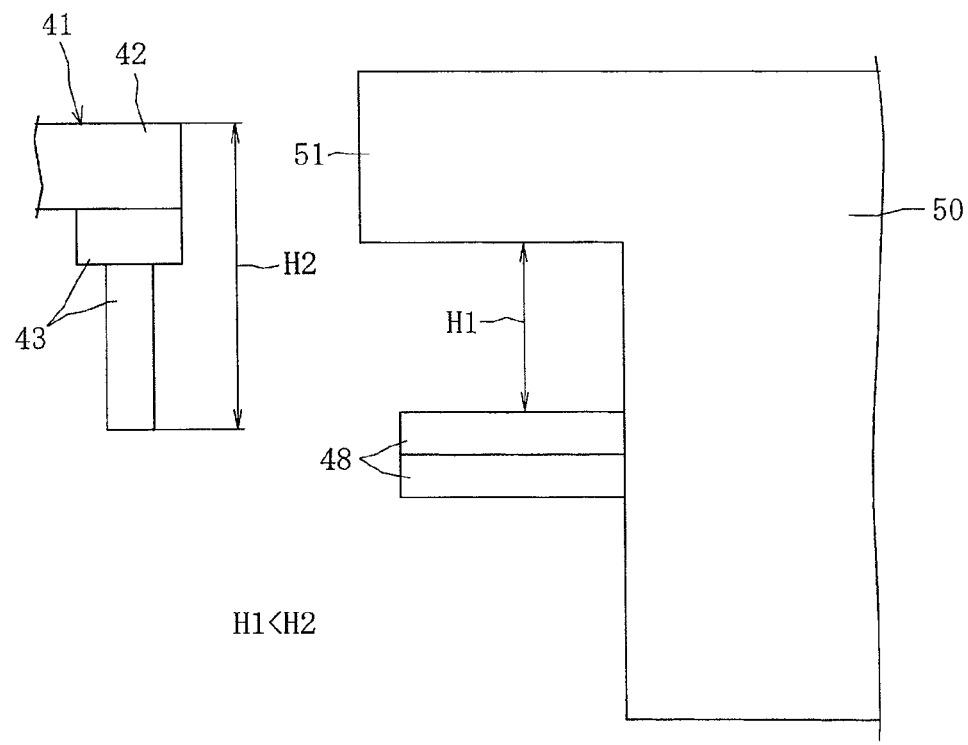
FIG. 10 is a schematic view showing an article subjected to supplemental explanation of a problem.

The structure of the resonator 1 according to the sixth embodiment of the present invention will be described with reference to FIG. 8. The resonator of this embodiment differs from the resonator shown in FIG. 1 in that the joining tool 3 is provided on one end of the ultrasonic horn 2. The vibrator 4 is joined to the other end of the ultrasonic horn 2 of FIG. 8. When the ultrasonic horn 2 has resonated with the ultrasonic vibration transmitted from the vibrator 4, the points of maximum vibration amplitude are disposed on the opposite ends of the ultrasonic horn 2, at least one of the points of minimum vibration amplitude is disposed between the positions of the points of maximum vibration amplitude and, at the position of the point of minimum vibration amplitude in the ultrasonic horn 2, the support parts 8 project outward from the outer surface of the ultrasonic horn 2. Therefore, the resonator 1 shown in FIG. 8 is in a state in which it is attached in a cantilever manner to a support (not shown) provided on the output member 29 of the joining apparatus 25 of FIG. 2.

What is claimed is:

1. A resonator for joining metal members utilizing ultrasonic vibration, comprising:

an ultrasonic horn having a length of at least half wavelength of a resonance frequency of ultrasonic vibration transmitted from a vibrator;

a joining tool provided on the ultrasonic horn so as to project in a direction normal to a vibration transmission direction of the ultrasonic horn at a position of a point of a maximum vibration amplitude of the ultrasonic horn; and a tool head comprising a linear bar provided on a distal end of the joining tool;

wherein a joining operation portion of the linear bar laterally projects farther than a widest portion of the joining tool, and wherein the distal end of the joining tool has a lateral width portion which is smaller than a lateral width of an upper portion of the joining tool and from which the tool head projects in a direction normal to the direction in which the joining tool projects.

2. A resonator for joining metal members utilizing ultrasonic vibration, comprising:

an ultrasonic horn having a length of at least half wavelength of a resonance frequency of ultrasonic vibration transmitted from a vibrator;

a joining tool provided on the ultrasonic horn so as to project in a direction normal to a vibration transmission direction of the ultrasonic horn at a position of a point of a maximum vibration amplitude of the ultrasonic horn; and a tool head comprising a linear bar provided on a distal end of the joining tool;

wherein a joining operation portion of the linear bar laterally projects farther than a widest portion of the joining tool, wherein the distal end of the joining tool has a lateral width portion which is smaller than a lateral width of an upper portion of the joining tool and from which the tool head projects in a direction normal to the direction in which the joining tool projects, and wherein the tool head is provided with a concave portion functioning as an escape to a metal member to be joined at a time of joining, hollowing from the joining operation portion to an inside of the tool head and opening in a lateral direction and downward.

3. A resonator for joining metal members utilizing ultrasonic vibration, comprising:
an ultrasonic horn having a length of at least half wavelength of a resonance frequency of ultrasonic vibration transmitted from a vibrator;
a joining tool provided on the ultrasonic horn so as to project in a direction normal to a vibration transmission direction of the ultrasonic horn at a position of a point of a maximum vibration amplitude of the ultrasonic horn; and
a tool head comprising a linear bar provided on a distal end of the joining tool;
wherein a joining operation portion of the linear bar laterally projects farther than a widest portion of the joining tool,
wherein the distal end of the joining tool has a lateral width portion which is smaller than a lateral width of an upper portion of the joining tool and from which the tool head projects in a direction normal to the direction in which the joining tool projects, and
wherein the tool head is provided with a concave portion functioning as an escape to a metal member to be joined at a time of joining, hollowing from the joining operation portion to an inside of the tool head, opening in a lateral direction and downward, and having a lateral width smaller than a lateral width of the joining tool.

4. A resonator according to claim 1, wherein the tool head is provided with a slit open in a lateral direction and downward to obtain effective vibration.

5. A resonator according to claim 1, wherein the tool head is joined to the distal end of the joining tool with a joining material.

6. A resonator according to claim 2, wherein the tool head is provided with a slit hollowing from the concave portion to the inside of the tool head and opening in a lateral direction and downward to obtain effective vibration.

7. A resonator according to claim 2, wherein the tool head is joined to the distal end of the joining tool with a joining material.

8. A resonator according to claim 3, wherein the tool head is provided with a slit hollowing from the concave portion to the inside of the tool head and opening in a lateral direction and downward to obtain effective vibration.

9. A resonator according to claim 3, wherein the tool head is joined to the distal end of the joining tool with a joining material.

10. A resonator according to claim 1, wherein the joining operation portion is joined to the tool head with a joining agent.

11. A resonator according to claim 2, wherein the joining operation portion is joined to the tool head with a joining agent.

12. A resonator according to claim 3, wherein the joining operation portion is joined to the tool head with a joining agent.

* * * * *